United States Patent [19]

Gary et al.

[11] 4,048,522
[45] Sept. 13, 1977

[54] SOLID STATE BREAK-BEFORE-MAKE BASE MODULE AND ASSOCIATED CONTACT ELEMENTS

[75] Inventors: Wardell Gary; Emroy W. Lange, both of Beaver, Pa.

[73] Assignee: Westinghouse Electric Corporation, Pittsburgh, Pa.

[21] Appl. No.: 765,507

[22] Filed: Feb. 3, 1977

Related U.S. Application Data

[63] Continuation of Ser. No. 576,833, May 12, 1975, abandoned.

[51] Int. Cl.² .................. H03K 3/295; H03K 5/13; H03K 17/60
[52] U.S. Cl. .................. 307/293; 307/252 B; 307/255; 361/197

[58] Field of Search ............ 317/137, 141 S, 148.5 B; 323/21, 22 SC; 307/252 B, 254, 255, 293

[56] References Cited

U.S. PATENT DOCUMENTS

| | | | |
|---|---|---|---|
| 3,588,540 | 6/1971 | Bohn | 307/293 |
| 3,656,005 | 4/1972 | Lee | 307/252 B |
| 3,740,587 | 6/1973 | Lee | 307/252 B |

Primary Examiner—Stanley D. Miller, Jr.
Attorney, Agent, or Firm—M. J. Moran

[57] ABSTRACT

Solid state relay system which includes a break-before-make function on both the opening and closing operation thereof is taught. The system may be utilized in conjunction with an "on" delay module or an "off" delay module or with a module that is generally instantaneous in operation.

8 Claims, 8 Drawing Figures

4,048,522

SOLID STATE BREAK-BEFORE-MAKE BASE MODULE AND ASSOCIATED CONTACT ELEMENTS

This is a continuation of application Ser. No. 576,833 filed May 12, 1975, now abandoned.

BACKGROUND OF THE INVENTION

This invention relates generally to solid state relay elements having break-before-make functions and it relates specifically to elements of the preceding type utilizing two transistors in a base module where various kinds of plug-in modules may be utilized on the same base module.

Solid state relays are known. In the past solid state relay modules have been provided which have on-time delays and off-time delays. In addition in the past, solid state relay modules have been provided which performed time-delayed functions in the making and breaking operation. However, in the past the break-before-make function did not reverse itself when comparing the closing operation and the opening operation; that is, if a device broke before it made on the closing operation, it also broke before it on made on or made the opening operation in the same relay or made. Sometimes, it is desirous that one circuit is not on at any time that another circuit is also on. In order to accomplish that a bracketing break-before-make operation is required; that is, the first circuit should be broken before the second circuit is energized and the second circuit should be de-energized before the first circuit is re-energized. It would be even more advantageous if this break-before-make bracketing function or operation could be accomplished on multiple contacts with synchronous break-before-make operations on all of the multiple contacts. It would be advantageous if the break-before-make bracketing function could be utilized with on-delay and off-delay contact modules.

SUMMARY OF THE INVENTION

In accordance with the invention apparatus is taught which teaches bracketing break-before-make solid state relay apparatus. A unitary power supply or input circuit is provided with translates the starting signal to multiple output circuits, each of which provides synchronous break-before-make operations. In the preferred embodiment there are four synchronous output circuits for every input circuit in a commercial module. In addition, the input signal is provided by a relay operation. The relay operation is of the solid state nature. This allows for cascading or ganging of relay circuitry. Two of the output modules may be utilized to drive an on-time delay module which provides an incremental delay between the time the input relay is energized until the time the output contacts change state. In a preferred embodiment, the output contacts are complementary, that is as one set of contacts opens the other closes. In addition, the bracketing bread-before-make function works at either end of the opening and closing operation. In another embodiment, an off-time delay apparatus is provided that turns on with a break-before-make operation and turns off after the input relay contact has been deenergized with a bracketing break-before-make operation and after a predetermined time delay. Non-time delay modules are provided which merely open and close in a break-before-make operation. No feedback is necessary between the latter elements except for transfer of intelligence in the output circuit of the base module.

BRIEF DESCRIPTION OF THE DRAWINGS

For a better understanding of the invention, reference may be had to the preferred embodiments shown herein in the accompanying drawings in which.

DESCRIPTION OF THE PREFERRED EMBODIMENTS

Figure 1:
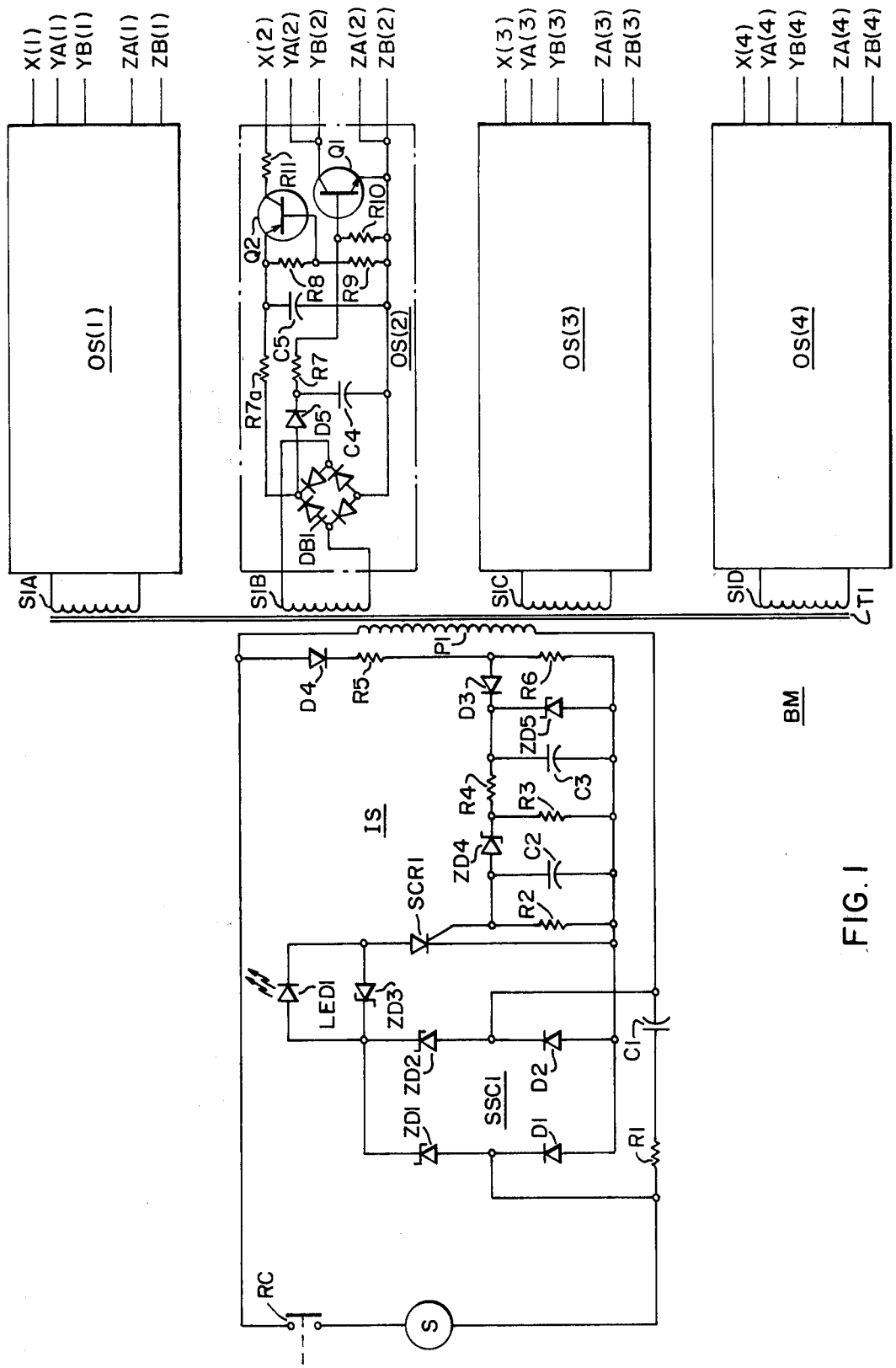
FIG. 1 shows a four output base module for a solid state relay.

Referring now to the drawings and FIG. 1 in particular, a base module BM for a solid state relay is shown. In this embodiment the base module BM comprises a unitary input circuit IS and four synchronously operable output circuits OS(1), OS(2), OS(3) and OS(4). The input terminals for the input stage IS are interconnectable with a source of alternating electrical current S and a series connected relay contact or similar signalling means RC such as pushbutton, etc. The upper end of the relay RC is connected concurrently to the upper side of a primary winding P1 of a transformer T1 and to the anode of a diode D4. The lower end of the relay contact is connected to the upper side of the previously described source S which may be a 120 volt alternating current power supply. The lower side of the source S is connected concurrently to one end of a resistive element R1 to one input terminal of a solid state contact SSC1. The latter connection is made between the cathode of a diode D1 and the anode of a Zener diode ZD1. The other end of the resistive element R1 is connected to one end of a capacitive element C1. The other end of the capacitive element C1 is connected to the other side of the primary winding P1 and to the other input terminal of the solid state contact SSC1. The latter connection is made at the junction between the cathode of a diode D2 and the anode of a Zener diode ZD2. The regulating terminals or cathodes of the latter Zener diodes ZD1 and ZD2 are connected together at the regulating terminal of a third Zener diode ZD3 and at the anode of a light emitting diode LED1. The cathode of the light emitting diode LED1 and the anode of the Zener diode ZD3 are connected together at the anode of a silicon controlled rectifier or similar gated means SCR1. The cathode of the previously mentioned diode D4 is connected to one side of a resistive element R5, the other side of which is connected concurrently to the anode of a diode D3 and to one side of a resistive element R6. The cathode of the diode D3 is connected concurrently to the regulating terminal of a Zener diode ZD5, one side of a capacitive element C3 and one end of a resistive element R4. The other end of the resistive element R4 is connected concurrently to one side of a resistive element R3 and to the regulating terminal of a Zener diode ZD4. The anode of the Zener diode ZD4 is connected concurrently to one side of a capacitive element C2, to one end of a resistive means R2, and to the gate of the previously described silicon controlled rectifier SCR1. The other ends of the previously mentioned diodes D1 and D2, as well as the other ends of the previously mentioned resistive elements R2, R3 and R6, and the other ends of the capacitive elements C2 and C3, and the other end of the Zener diode element ZD5, are connected together and to the cathode of the silicon controlled rectifier SCR1.

The transformer T1 has in the preferred embodiment of the invention four generally identical secondary windings S1A S1B, S1C and S1D. The secondary winding S1A drives an output stage OS(1), the secondary winding S1B drives an output state (OS(2), the secondary winding S1C drives an output stage OS(3), and the secondary winding S1D drives an output stage OS(4). Each of the previously described output stages OS(1) through OS(4) has five outputs. The first output is designated the X output, the second output is designated the YA output, the third output is designated the YB output, the fourth output is designated the ZA output and the fifth output is designated the ZB output. The particular output stage in question is identified in each case by a number in parentheses behind the appropriate letter. As an example, the output stage OS(3) has an X(3) output, the output stage OS(4) has a YB(4) output and the output stage OS(1) has an output terminal ZB(1).

The operation of the output stages are generally similar and identical and simultaneous with regard to the application and removal of energy from the primary winding P1 of the transformer T1. Since the output stages are identical, the electrical interconnection of the elements and the description of the elements for only one of them will be described, it being understood that the others are essentially the same. The output stage OS(2) comprises a diode bridge DB1 connected across the output terminals of the secondary winding S1B. Connected across the output windings of the diode bridge DB1 are the elements of the output stage O(2). There is connected to the positive output winding one side of a resistive element R7a and the anode of a diode element D5. The other side of the resistive element R7a is connected concurrently to one side of a capacitive element C5, to one side of a resistive element R8, and to the emitter of a transistor Q2. The base of the transistor Q2 is connected to the other side of the resistive element R8 and to one side of a resistive element R9, the other side of which is connected to the negative output terminal of the bridge DB1. The collector of the transistor Q2 is connected to one side of a resistive element R11, the other side of which represents the X(2) terminal of the output stage OS(2). The other side of the previously mentioned capacitive element C5 is also connected to the negative or return terminal of the bridge DB1. The other side of the cathode of the diode D5 is connected concurrently to one side of a capacitive element C4 and to one side of a resistive element R7. The other side of the resistive element R7 is connected to one side of a resistive element R10 and to the base of a transistor Q1. The collector of the transistor Q1 represents the YA(2) and YB(2) output terminals of the output stage OS(2). The emitter of the transistor Q1, the other side of the resistive element R10 and the other side of a capacitive element C4 are also tied together and connected to the return or negative side of the diode bridge DB1. This latter point also represents the two output terminals ZA(2) and ZB(2) for the output stage OS(2).

Figure 2:
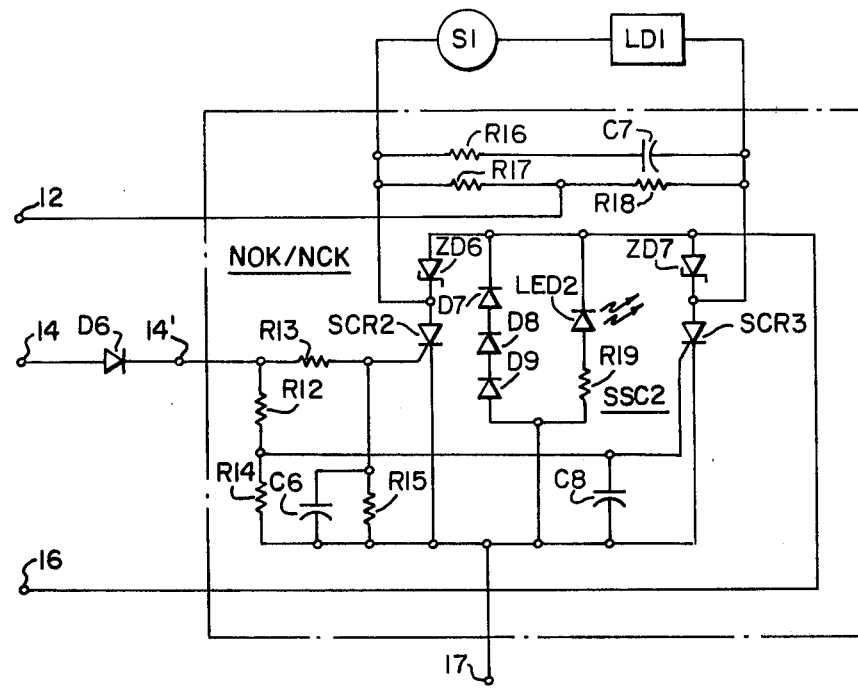
FIG. 2 shows a schematic diagram of a dual function (NOK/NCK) normally opened or normally closed contact module.

Referring now to FIG. 2 a dual purpose contact NOK/NCK of the solid state variety is shown. The dual purpose solid state contact (designated NOK/NCK to denote its dual purpose) may be wired in conjunction with any one of the output stages of the previously shown base module IS to provide either a normally open contact function or a normally closed contact function. Four terminals designated 12, 14, 16 and 17 are provided for interconnection with the output terminals of the previously described output circuits of the base module of FIG. 1 to accomplish either a normally open function or a normally closed function.

There is provided a diode D6, the anode of which is connected to the terminal 14, and the cathode of which is connected concurrently to a pair of current dividing resistors R13 and R12. The other end of the current dividing resistor R12 is connected concurrently to one end of a resistive means R14, to one of a capacitive means C8 and to the gate of a silicon controlled rectifier SCR3. In a like manner, the other end of the resistive element R13 is connected to one end of a resistive element R15, one end of a capacitive element C6, and to the gate of a silicon controlled rectifier SCR2. The other ends of the resistive elements R14 and R15, as well as the other ends of the capacitive elements C6 and C8 are tied together and to the cathodes of the silicon controlled rectifiers SCR2 and SCR3. This junction also forms the previously described terminal 17. The common input terminal to the current dividing resistors R12 and R13 is designated 14'. The use of terminal 14' will be described hereinafter. The anode of the silicon controlled rectifier SCR2 is connected concurrently to the regulating terminal of a Zener diode ZD6, to one end of a resistive element R17, to one end of a resistive element R16 and to one end of the series combination of a source of electrical current S1 and a load LD1. The anode of the silicon controlled rectifier SCR3 is connected to the regulating terminal of a Zener diode ZD7, to one side of a resistive element R18, to one end of a capacitive element C7, and to the other end of the series combination of the source S1 and the load LD1. The other end of the capacitive element C7 is connected to the other end of the resistive element R16 and provides a voltage suppression network for the silicon controlled rectifiers SCR2 and SCR3. The other end of the resistive element R18 is connected to the other end of the resistive element R17 and forms the terminal 12 which was previously described. These latter two resistive elements R17 and R18 provide a voltage divider for providing electrical current to the terminal 12 from the source S1 and the load LD1. This is useful in the normally closed contact state for the dual function contact means NOK/NCK of FIG. 2. The other respective ends of the previously described Zener diodes ZD6 and ZD7 are connected together and to the cathode of a diode D7 as well as the cathode of a light emitting diode LED2. The other end of the light emitting diode LED2 is connected to one end of a resistive element R19. The anode of the diode D7 is connected to the cathode of a diode D8. The anode of the diode D8 is connected to the cathode of a diode D9, the anode of which is connected to the other end of resistive element R19 and to the terminal 17. The previously described cathode of the light emitting diode LED2 and the junction it forms with other elements of the circuit of FIG. 2 forms the terminal 16 previously described.

Figure 2A:
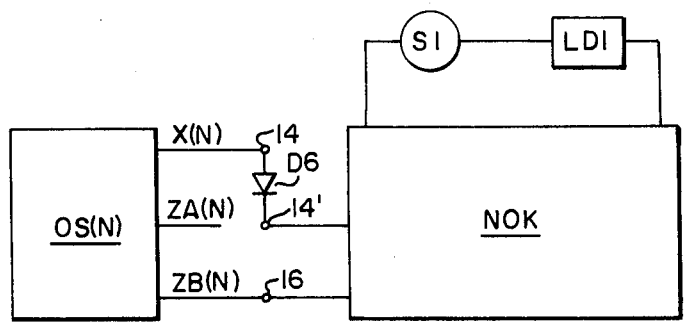
FIG. 2A shows the dual function module of FIG. 2 wired to the base module of FIG. 1 in a normally opened (NOK) arrangement.

Referring now to FIG. 2A, the interconnection of the apparatus of FIG. 2 is shown for the normally open contact state or arrangement. The interconnection is shown with an output stage OS(N) of the base module of FIG. 1. In this case, the source S1 and load LD1 are shown connected as outputs for the normally open contact NOK. The terminal 14 and the terminal 14' are shown with the interplaced diode D6. The terminal 16 is shown. The terminal 14 is connected to the X(N) output of the output stage OS(N). The terminal 16 is connected to the ZB(N) output terminal of the stage OS(N). In this operation the normally open contact NOK acts as if it were a relay contact which is opened when the relay contact RC shown in FIG. 1 is opened.

Figure 2B:
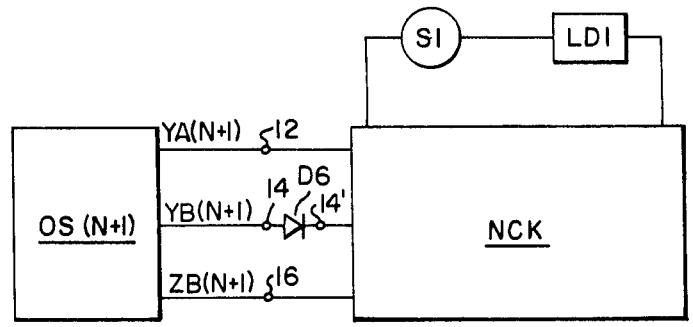
FIG. 2B shows the dual module of FIG. 2 wired to the base module of FIG. 1 in a normally closed (NCK) configuration.

Referring now to FIG. 2B, the normally closed contact state for the apparatus of FIG. 2 is shown. The normally closed contact NCK is shown connected at its output to the series connected arrangement of the source of electrical power S1 and the load LD1. Once again the terminals 14 and 14' with the interdisposed diode D6 are also shown. The terminal 12 this time is connected to the YA(N+1) terminal of the output stage OS(N+1). The terminal 14 is connected to the YB(N+1) output terminal of the same stage, and finally the terminal 16 is connected to the ZB(N+1) output terminal of the previously described stage. In this connection, the normally closed contact NCK acts as a closed relay contact thus empowering the load LD1 from the source S1 when the relay contacts RC shown in FIG. 1 are opened. The contact NCK opens when the relay contact of relay RC of FIG. 1 closes.

Figure 3:
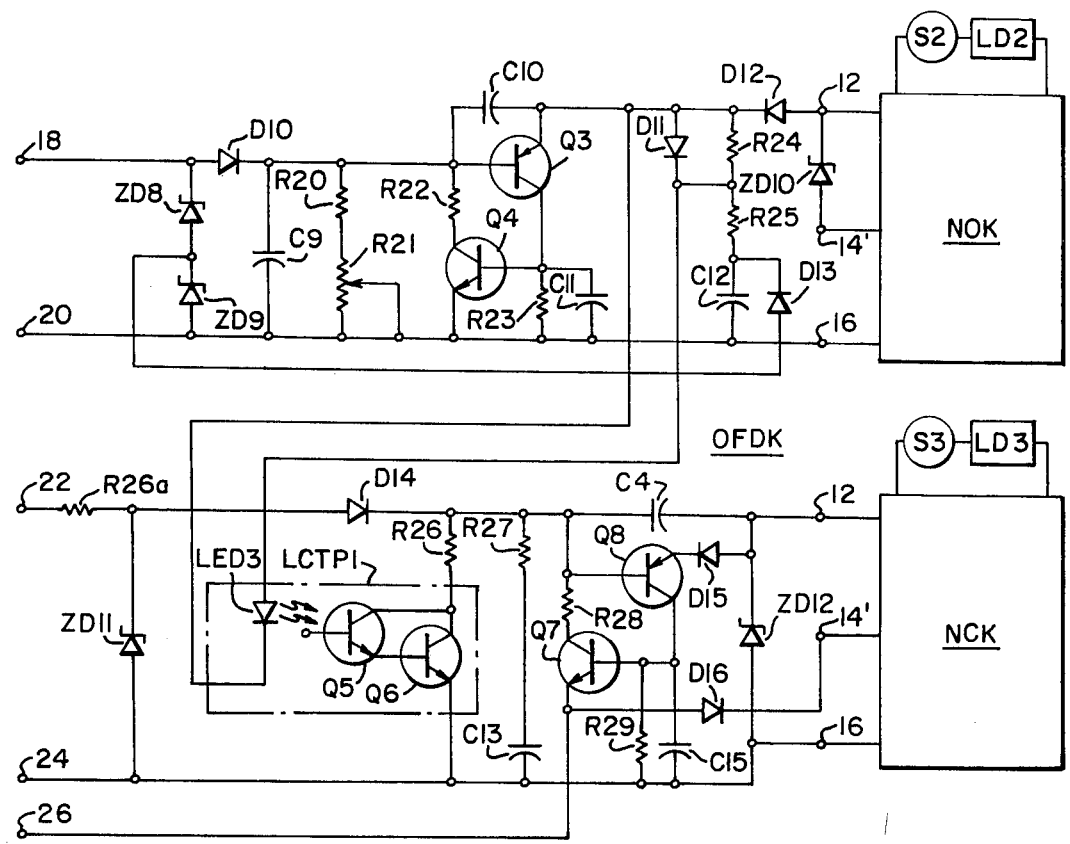
FIG. 3 shows a complementary output solid state relay module for utilization with the circuitry of FIG. 1 and for off-delay.

Referring now to FIG. 3 and to FIG. 3A, an off-delay contact module utilizing the concepts previously discussed will be described. In particular, referring to FIG. 3A, the wiring arrangement for the off-delay contact means OFDK, when used in conjunction with output stages OS(N) and OS(N+1), are shown. In particular, the lead 18 is connected to the X(N) output terminal, the lead 20 is connected to the ZB(N) output terminal, the lead 22 is connected to the X(N+1) output terminal, the lead 24 is connected to the ZN(N+1) output terminal, and finally the lead 26 is connected to the YA(N+1) output terminal. In operation, the upper output contact NO of the off-delay module OFDK is normally opened such that the source of electrical power S2 is not available to provide energy to the load LD2. On the other hand, the normally closed or lower contact NC, which is interconnected with the source S3 and the load LD3, is closed normally allowing the source S3 to provide electrical energy to the load LD3.

Referring once again to FIG. 3, it can be seen that terminal 18 is connected at one end thereof to the anode of a diode D10 and to the regulating terminal of a Zener diode ZD8. The cathode of the diode D10 is connected to one side of a capacitive element C9, to one side of the resistive element R20, to one side of a resistive element R22, to one side of another capacitive element C10 and to the base of the transistor Q3. The collector of the transistor Q3 is connected concurrently to one side of a diode element D11 to the other side of the capacitive element C10, to one side of a resistive element R24 and to the cathode of a diode D12, the anode of which is connected to the terminal 12 of a normally open contact module NOK, such as is shown in FIG. 2. This latter terminal is also connected to the regulating terminal of a Zener diode ZD10, the anode of which is connected to the terminal 14' also shown in FIG. 2. The other end of the Zener diode ZD8 is connected to the regulating terminal of a Zener diode ZD9 and to the anode of a diode D13. The other end of the resistive element R20 is connected to one end of a resistive element or potentiometer R21. The other end of the resistive element R22 is connected to the collector of a transistor Q4, the base of which is connected concurrently to the collector of the previously described transistor Q3, to one end of a resistive element R23 and to one end of the capacitive element C11. The other end of the diode element D11 is connected to the other end of the resistive element R24 and to one end of a resistive element R25 as well as to the anode of a light emitting diode LED3. The other end of the resistive element R25 is connected to one end of the capacitive element C12 and to the cathode of the previously described diode D13. Terminal 20 is connected concurrently to the anode of the Zener diode ZD9, to the other side of the capacitive element C9, to the other side of the resistive element 21 (including the wiper thereof), to the emitter of the transistor Q4, to the other side of the resistive element R23, to the other side of the capacitive element C11 and to the other side of the capacitive element C12. Connected to the cathode of the light emitting diode LED3 is the anode of the diode D11. Terminal 22 is connected to one end of a resistive element R26a, the other end of which is connected concurrently to the regulating terminal of a Zener diode ZD11 and to the anode of a diode D14. The cathode of the diode D14 is connected concurrently to one end of a resistive element R26, to one end of a resistive element R27, to one end of a resistive element R28 to the base of a transistor Q8 and to one side of a capacitive element C4. The emitter of the transistor Q8 is connected to the cathode of a diode D15, the anode of which is connected to the other side of the capacitor element C4 and to the terminal 12 of the normally closed contact NCK. In addition, this latter terminal is connected to the regulating terminal of a Zener diode ZD12. The other side of the resistive element R26 is connected to one terminal of a light coupled transistor pair arrangement LCTP1 which comprises the transistors Q5 and Q6 interconnected at the collectors thereof. These transistors are effected by the light from the light emitting diode LED3. The emitter of the transistor Q5 is connected to the base of the transistor Q6. The other side of the resistive element R27 is connected to one side of a capacitive element C13. The other side of the resistive element R28 is connected to the collector of a transistor Q7, the emitter of which is connected to the terminal 26 previously described and to the anode of a diode element D16, the cathode of which is connected to terminal 14' of the normally closed contact NCK. The base of the transistor Q7 is connected concurrently to one side of a resistive element R29, to one side of the capacitive C16 and to the collector of the transistor Q8. The terminal 24 which in essence is the same as the terminal 16 of the normally closed contact NCK is connected concurrently to the other side of the Zener diode element ZD11, to the emitter of the transistor Q6, to the other side of the capacitve element C13, to the other side of the resistive element R29 an to the othe side of the capacitive element C15 as well as the other side of the regulating diode ZD12. The source S2 and the series connected load LD2 are connected to the normally open contact module NOK and the source S3 and the load LD3 are connected in series circuit relationship with the module NCK.

Figure 4:
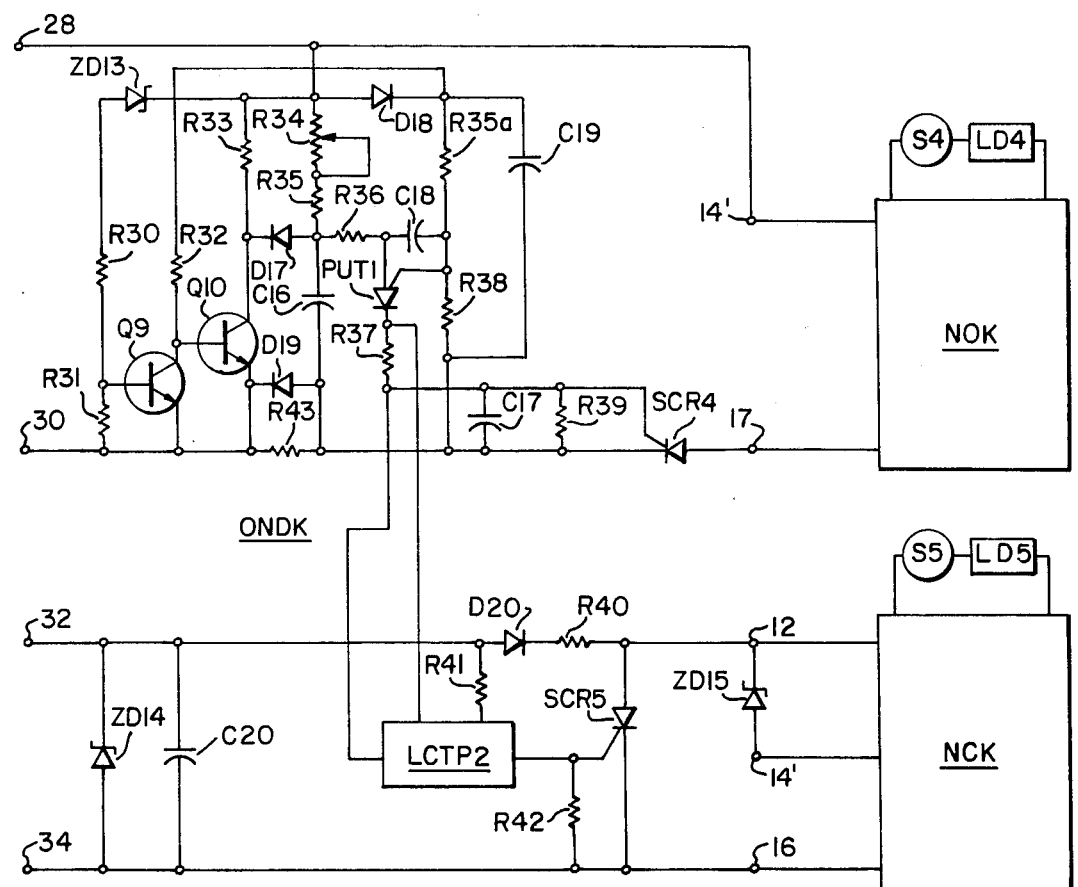
FIG. 4 shows a complementary output relay module with an on-delay function for utilization with the circuitry of FIG. 1.
Figure 4A:
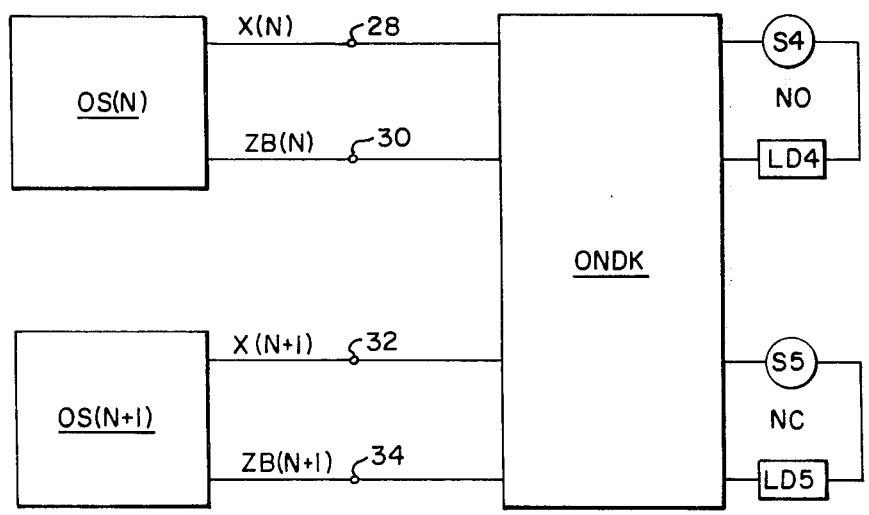
FIG. 4A shows the wiring arrangement of the apparatus of FIG. 4 when utilized with the apparatus of FIG. 1.

Referring now to FIG. 4A, an on-delay contact arrangement ONDK utilizing the concepts previously described is shown. The on-delay contact ONDK with its normally open contact portion NOK (shown in FIG. 4) is interconnected with a source S4 and a load LD4 and its normally closed portion NCK (shown in FIG. 4) is interconnected with a source S5 and a load LD5. Terminal 28 of the on-delay contact ONDK is connected to the X(N) terminal of the module OS(N). The terminal 30 is connected to the ZB(N) terminal of the latter module. The terminal 32 is connected to the X(N+1) terminal of the module OS(N+1) and the terminal 34 is connected to the ZB(N+1) terminal of the latter module.

Referring now to FIG. 4, it can be seen that the terminal 28 is connected directly to the terminal 14' of the NOK module. In addition, the latter terminal is connected concurrently to the regulating terminal of a Zener diode ZD13, to one side of a resitive element R33, to one side of a resistive element or potentiometer R34 and to the anode of a diode D18. The other side of the Zener diode ZD13 is connected to one side of a resistive element R30, the other side of which is connected to one side of a resistive element R31 and to the base of a transistor Q9. The other side of the resistive element R31 and the emitter of the transistor Q9 are connected to the terminal 30 of the on-delay contact ONDK. The other side of the resistive element R33 is connected concurrently to the collector of a transistor Q10 and to the cathode of a diode D17. The base of the transistor Q10 is connected to the collector of the transistor Q9 and the emitter of the transistor Q10 is connected concurrently to the terminal 30, to one side of a resistive element R43 and to the cathode, of a diode D19. The other side of the resistive element R34 is connected to one side of a resistive element R35 as is the wiper of the potentiometer R34. The other end of the resistive element R35 is connected concurrently to the other side of the anode of the diode D17 and to one side of a resistive element R36 as well as to one side of a capacitive element C16. The other side of the capacitive element C16 is connected to the anode of the diode D19 and to the other side of the resistive element R43. The other side of the diode element D18 is connected concurrently to one side of a resistive element R35a and to one side of a capacitive element C19. In addition, this latter terminal is connected to one side of a resistive element R32, the other end of which is connected to the base of the transistor Q10. The other side of the resistor R36 is connected to one side of a capacitive element C18 and to the anode of a programmable unijunction transistor PUT1. The another side of the resistive element R35a is connected to the other side of the capacitive element C18, to the gate of the programmable transistor PUT1 and to one side of a resistive element R38. The cathode of the programmable unijunction transistor PUT1 is connected concurrently to one side of a resistive element R37 and to the light emitting diode input terminal of a light coupled transistor pair LCTP2. The other terminal of the light emitting dioe of the transistor pair LCTP2 is connected to the other side of the resistive element R37, to one side of a capacitive element C17, to one side of a resistive element R39, and to the gate of a silicon controlled rectifier SCR4. The gate of the programmable unijunction transistor PUT1 is connected to one side of a resistive element R38. The anode of the silicon controlled rectifier SCR4, the other side of the resistive element R39, the other side of the capacitive element C19, the other side of the capacitive element C17, the other side of the resistive element R38, and the other side of the resistive element R43 are all connected together. Terminal 32 is connected concurrently to ons side of a Zener diode ZD14, to one side of a capacitive element C20, to one side of a resistive element R41, and to the anode of a diode D20. The cathode of the diode D20 is connected to one side of a resistive element R40, the other side of which is connected concurrently to the terminal 12 of the normally closed contact NCK, to the regulating terminal of a Zener diode ZD15, and to the anode of the silicon controlled rectifier SCR5. The other side of the Zener diode ZD14 is connected to the terminal 14' of the normally closed contact NCK. The other side of the resistive element R41 is connected to the transistor side of the light coupled transistor pair LCTP2. The output terminal of this particular portion of the transistor pair is connected to one side of the resistive element R42 and to the gate of the silicon controlled rectifier SCR5. The actual light emitting diode and transistor pair for the element LCTP2 are not shown for convenience of illustration. Terminal 34 in essence is the same as the terminal 16 of the normally closed contact NCK. Connected thereto are the other side of the Zener diode ZD14, the other side of the capacitive element C20, the other side of the resistive element R42 and the other side of the silicon controlled rectifier SCR5. Also shown in FIG. 4 are the series connected source S4 and load LD4 for the normally open contact NOK and the series connected source S5 and load LD5 for the normally closed contact NCK.

OPERATION OF THE INPUT STAGE IS

Referring once again to FIG. 1 it can be seen that the input stage IS may be driven by the source S which may be a 120 volt AC source. Connected in series with the sources may be a relay contact RC which in fact may be a portion of the solid state relay. Consequently it is possible that leakage current may flow in the circuit the latter two elements. For this reason, the input stage IS is provided to prevent energization of the primary winding P1 below a certain threshold voltage which may be 65 or 70 volts AC. Inoperation it is to be presumed that the silicon controlled rectifier SCR1 is in the off state before the relay contact RC is closed. Once the relay contact RC is closed, circuit cannot flow through the primarywinding P1 to the other side of the source S because the solid state switch SSC1 is in the block or off state. However, current may flow through the diode D4, the two resistive elements R5 and R6 and through the diode D1 to the other side of the source S. The diode D4 acts as a half wave rectifier for the current. The voltage divider (R5, R6) acts as a current limiter. In addition to that, the voltage divider (R5, R6) provides half wave rectified current to the anode of the diode D3 which charges the capacitive element C3 until it reaches the regulating voltage of the Zener diode ZD5. Generally thereafter, DC current flows through the voltage divider (R3, R4). A voltage is produced across the resistive element R3 which breaks down the Zener diode ZD4 thus providing actuating or energizing current to the gate of the silicon controlled rectifier SCR1. The resistive element R2 and the capacitive element C2 act as a voltage suppression network to prevent spurious energization and turn-on of the silicon controlled rectifier SCR1. Once the silicon controlled rectifier SCR1 is actuated, current may flow through the solid state contact SSC1. On positive half cycles the current flows from the terminal to the right of the capacitive element C1 as viewed in FIG. 1 throgh the regulating Zener diode ZD2 and concurrently through the light emitting diode LED1 and the Zener diode ZD3, through the silicon controlled rectifier SCR1 and through the diode D1 to the other side of the source S. Most of the current through the combination of the light emitting diode LED1 and the Zener diode ZD3 flows through the light emitting diode LED1. On negative half cycles current flows from the terminal to the left of the resistive element R1 through the Zener diode ZD1 and then through the combination of the light emitting diode LED1 and Zener diode ZD3, through the silicon controlled rectified SCR1 and through the diode D1 to the other side of the source S. Most of the current through the combnation of the light emitting diode LED1 and the Zener diode ZD3 flows through the light emitting diode LED1. On negative half cycles current flows from the terminal to the left of the resistive element R1 through the Zener diode ZD1 and then through the combination of the light emitting diode LED1 and Zener diode ZD3, through the silicon controlled rectifier SCR1, back through the diode D2 to the primary winding P1 and then back to the other side of the source S. The series connected resistive element R1 and capacitive element C1 prevent the thyristor or silicon controlled rectifier SCR1 from turning on from its anode-to-cathode circuit due to a fast rise in voltage thereacross with respect to time. Consequently, the input stage IS will not energize the primary winding P1 until the voltage provided as an input reaches a threshold value which may be 65 or 70 volts.

OPERATION OF THE OUTPUT STAGE OS(N)

The four secondary windings S1A through S1D for the transformer T1 are each connected to one output stage OS(1) through OS(4) of the base module BM respectively. Three of the output stage modules OS(1), OS(3) and OS(4) are shown in block diagram form, it being understood that the operation of the remaining module OS(2) is similar thereto. Module OS(2) provides a unique break-before-make function for the solid state relay which includes the base module and various contact arrangements which may be connected to the output of the base module BM. The actual off, on and time delay functions will be described hereinafter with respect to other figures. In general, the transistor Q1 provides when interconnected with a load such as will be described hereinafter the break or turn-off contact function. On the other hand, the transistor Q2, when interconnected with other contact means which will be described hereinafter, provides the make function or turn-on contact function. In a preferred embodiment of the invention, there is an 8 millisecond delay between the break function provided by the transistor Q1 and its associated circuitry and the make function provided by the transistor Q2 and its associated circuitry. Presuming that the secondary winding S1B has been energized by the energization of the primary winding P1 as was described previously, voltage will be provided concurrently to the anode of the diode D5 and to the left side of the resistive element R7a. With respect to the diode D5, the capacitive element C4 connected to the cathode thereof is generally instantaneously charged to its peak value. Current is then provided through the voltage divider comprising the resistive elements R7 and R9 to the base of the common emitter connected transistor Q1 causing that transistor to change from an off or non-conducting state to an on or conducting state. This latter action happens or occurs generally instantaneously with the energization of the secondary winding S1B. On the other hand, the presence of the resistive element R7a and the capacitive element C5 in the input circuit for the transistor element Q2 delays energization of the latter transistor. The voltage across the capacitive element C5 slowly rises to a peak value which is impressed across the voltage divider combination of the resistive elements R8 and R9. When the voltage across the resistive element R8 approaches some predetermined finite value which is positive from the emitter to base of the transistor Q2, that transistor is turned on or placed in a conducting state. The resistive element R11 is utilized for current limitation through the transistor Q2 during operating situations. Of course it is to be understood that the operation of the output stage module is dependent upon interconnection with various loading devices such as contacts. It is also apparent from viewing FIG. 1 that all of the break-before-make or output stage modules OS(1) through OS(4) may operate concurrently although they may perform different functions ultimately depending upon which devices are interconnected to their output terminals. The make function of the transistor Q2 is present at the terminal X(2). The latter terminal is used in conjunction with the terminal ZB(2). The break function is provided at the collector of the transistor Q1 at the terminal YB(2). This terminal is internally connected with terminal YA(2). In a like manner, the previously mentioned terminal ZB(2) is interconnected internally with terminal ZA(2). Each of the modules OS(1) through OS(4) has a corresponding set of five output terminals. Note that since all of the modules OS(1) through OS(4) are identical, the break-before-make function occurs in all modules simultaneously. This meas as an example that the break function could be provided in modle OS(2) whereas the time delayed make function could be derived from module OS(1).

OPERATION OF THE NORMALLY OPENED OR NORMALLY CLOSED CONTACT NOK/NCK

Referring now to FIG. 1, FIG. 2, FIG. 2A; a normally opened or alternately, normally closed dual function contact arrangement NOK/NCK is provided. This contact may be wired or interconnected with the various output stages OS(1) through OS(4) of the base module BS to provide either a normally closed or a normally opened function as desired. In the normally opened mode of operation, the terminal 12 and the terminal 17 are not utilized, rather a source of electrical current is provided between the terminals 16 and 14. This may for example be the current which is available between the terminals ZB(N) and X(N) of one of the output modules OS(L) through OS(4) as shown in FIG. 1. The latter arrangement is shown in FIG. 2A. In the normally opened contact mode, the solid state contact SSC2 is opened. Consequently, no electrical energy is transferred from the source S1 to the load LD1. However, if electrical current flows through the diode D6, it will divide generally evenly through the current divider represented by the resistors R12 and R13 to provide current to the gates of the silicon controlled rectifiers SCR2 and SCR3 respectively. The current in each case flows through the gate to cathode circuit of the apparent silicon controlled rectifiers and then through the resistive means R19 and the light emitting diode LED2 to the return terminal 16. It is unlikely in the case of a low amount of current that the diodes D7 through D9 will be conducting because insufficient voltage is provided across the combination of the light emitting diode LED2 and resistor R19 to cause those diodes to conduct. The light emitting diode LED2 at this time will indicate that the normally open contact NOK is in the state of being closed or has been closed completely, as will be described hereinafter. The resistive element R14 and capacitive element C8, and the resistive element R15 and capacitive element C6 act as voltage suppression networks for the gates of the silicon controlled rectifiers SCR3 and SCR2 respectively. Once the silicon controlled rectifiers SCR2 and SCR3 have been energized at their gates load currents may flow through the solid state contact SSC2. A positive half cycle of current will flow through the load LD1 into the silicon controlled rectifier SCR3 back through the resistive element R19 and the light emitting diode LED2 as well as through the now turned-on series connected diodes D7, D8 and D9, through the Zener diode ZD6, to the other side of the source S1. On the other hand, negative half cycles will flow in the opposite direction through the silicon controlled rectifier SCR2, back again through the combination of the resistive element R19 and the light emitting diode LED2, as well as the series combination of diodes D7, D8 and D9, through the conducting Zener diode ZD7 to the other side of the source S1. Consequently, the solid state contact SSC2 provides an alternating current path for the load LD1. The light emitting diode remains energized at this time to indicate that the normally opened contact NOK has been closed. Note that the diode D6 is connected at the anode thereof to the terminal 14 and at the cathode thereof to the terminal 14'. In some utilizations of the contact means NOK/NCK, the diode D6 is not utilized.

The contact means NOK/NCK may be used as a normally closed contact which is to be opened upon the occurrence of an event. As an example, by referring to FIG. 2 and FIG. 2B, it can be seen that if the terminal 12 is connected to the YA(N+1) terminal of an output stage OS(N+1) and the terminal 14 is connected to the terminal YB(N+1) terminal thereof, and if the terminal 16 is connected to the terminal ZB(N+1), a normally closed contact will be opened when the relay or pushbutton RC of FIG. 1 is closed.

Referring to FIG. 1, FIG. 2, and FIG. 2B, the operation of the contact means NOK/NCK in the normally closed state will be described hereinafter. In this case the voltage divider R17 and R18 provides a voltage to the contact terminal 12, which is interconnected as described previously with respect to FIG. 2B. This terminal is internally connected with the terminal 14 by way of circuitry in the output stage of the base module BM. This provides current through the diode D6 as described previously to cause the silicon controlled rectifiers SCR2 and SCR3 to remain conducting, thus providing a current path for load current flowing through the load LD1. When the contact RC is closed the transistor Q1 in the output stage OS(N+1) will short-circuit the contacts 14 and 12 to the ground contact 16. This causes the conducting silicon controlled rectifiers SCR2 and SCR3 to cease to conduct. This causes the solid state contact SSC2 to open, thus preventing current from flowing through the load LD1. It will be noted that this action occurs almost simultaneously with the closing of the relay contact RC in the input circuit IS of the base module BM of FIG. 1. The previously described closing of the normally open contact as described with respect to FIG. 2A will be delayed by the operation of the delay circuitry in the module OS(N). In both the normally open contact and normally closed contact operation the resistive element R16 and capacitive element C7 act as noise suppressor circuits for the solid state contact SSC2.

OPERATION OF THE SOLID STATE OFF-DELAY NETWORK OFDK

An off-delay network is such that the contacts will turn on normally but a specified delay is interposed when the contacts are to be turned off.

Figure 3A:
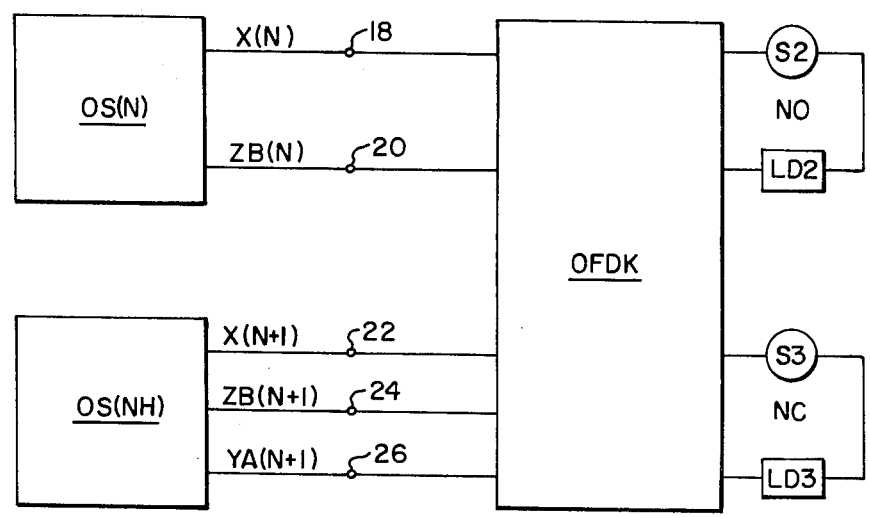
FIG. 3A shows the wiring arrangement of the apparatus of FIG. 3 when utilized with the apparatus of FIG. 1.

Referring now to FIG. 1, FIG. 3 and FIG. 3A, an off-delay contact OFDK, which is utilizable with two output stages OS(N) and OS(N+1) of the base module BM shown in FIG. 1, is depicted. In operation the load LD2 is not connected to the source S2, but the load LD3 is connected to the source S3 and is therefrom energized. When the contact RC is closed, as shown in FIG. 1, the normally closed contact NCK will open almost instantaneously and the normally opened contact NOK will close a short time thereafter. This is the previously described break-before-make operation. However, when the relay contact RC is opened again, there will be a time delay before the closed contact NOK associated with the load LD2 opens once again and the open contact NCK associated with the load LD3 closes once again. In addition, in keeping with the break-before-make characteristic of this invention, that contact which is to open will open at least 8 milliseconds, for example, before that contact which is to close closes.

Referring now to FIG. 1 and FIG. 3, the operating status of the normally open contact NOK and the normally closed contact NCK before the switch RC is closed will be described. The normally open contact NOK is essentially the same as the module NOK/NCK shown in FIG. 2. Likewise, the normally closed contact NCK is also essentially the same as the shown in FIG. 2. Source S2 and load LD2 associated with the normally open contact NOK are shown and source S3 and load LD3 associated with the normally closed contact NCK are also shown. Since the normally open contact NOK should prevent current from flowing through the load LD2, that action will be described hereinafter. Current flows out of the terminal 12 as was described previously with respect to the operation of a normally closed contact NCK, through the diode D12, through the transistor pair Q3 and Q4, from which it flows back to the return line 16. The low voltage drop on the transistor pair Q3, Q4 prevents any current from flowing through the diode ZD10 back to the terminal 14'. The capacitive element C10, which is disposed across the base-to-emitter circuit of the transistor Q3 is for noise suppression purposes, as is the parallel combination of the resistor element R23 and capacitor element C11. The normally closed contact NCK is retained in a closed state by allowing current which flows out of terminal 12 to flow through the diode D15 and then through the transistor pair Q7 and Q8 through the diode D16 to the terminal 14' of the normally closed contact NCK. This energizes the solid state contact in the normally closed contact as was described previously with respect to the operation of the apparatus shown in FIGS. 2 and 2B. Capacitive element C4 provides a voltage suppression for the transistor element Q8. Resistive element R29 and capacitive element C15 provide a noise suppression network for the transistor element Q7.

Presume now that the switch RC of FIG. 1 is closed. Since the desired function is an off-delay function, the normally opened contact NOK and the normally closed contact NCK should be relatively unaffected by the circuitry of the off-delay contact OFDK. However, the break-before-make function should still operate. Since line 24 is connected to terminal ZB(N+1) and line 26 is connected to a terminal YA(N+1), virtually a dead short is provided thereacross as was described previously. This therefore provides a short-circuit sink for the current that was flowing out of the emitter of transistor Q7 into the terminal 16 rather than into the terminal 14' as was the case previously. This has the effect of turning a normally closed contact off; that is, it opens the normally closed contact NCK. On the other hand, it is desirous to generally close the normally open contact NOK with only some slight time delay, such as 8 milliseconds, from the opening of the normally closed contact NCK. This is the previously described break-before-make function. This is accomplished by utilizing the previously described resistor R11 to which the terminal 18 is connected in conjunction with the capacitive element C9. This provides a slight time delay before the transistors Q3 and Q4 are turned off, thus providing the best path for current flow from the terminal 12 through the Zener diode ZD10 into the terminal 14', thus causing the normally open contact NOK to close as was described previously with respect to FIGS. 2 and 2A.

During this time period it is necessary to charge capacitive elements in both circuits to provide for an off-delay function when the switch RC is eventually opened again. In the upper circuit of FIG. 3, the capacitor C12 is charged by current flowing through the Zener diode ZD8 from the line 18 and then through the diode D13 into the capacitive element C12 and back to the line or terminal 20. On the other hand, the capacitive element C13 is charged by current flowing through the resistive element R26a and the diode D14 and the resistive element R27, the capacitive element C13 and back to the terminal 24.

When the relay RC of FIG. 1 is once again opened, the voltage is removed from between the terminals 18 and 20, as was described previously. This allows the capacitive element C9 to discharge between through the resistive elements R20 and R21. The capacitive element C12, on the other hand, maintains the emitter of the transistor Q3 at a higher voltage value than the base thereof until the capacitive element C9 has discharged to a certain value. When this occurs, the transistor pair Q3, Q4 begins to conduct once again, consequently providing the low current path between the terminals 12 and 16, thus opening the closed contacts of the element NOK. In conjunction with this, a discharge path is provided for the capacitor C12 through the resistive element R25 and through the light emitting diode LED3. This path is completed through the now conducting transistor pair Q3, Q4 back to the other side of the capacitive element C12. When the light emitting diode LED3 conducts, light is provided to the pair Q5, Q6 of the light coupled transistor pair LCTP1. This causes an immediate discharge of the capacitive element C13 through the resistive element R27 and the resistive element R26. Since the capacitive element C13 maintained the transistor pair Q7 and Q8 in an open or blocking state previous to this, those two transistors will conduct, thus providing a current path between the terminals 12 and 14', thus closing the contact NCK which was previously opened. Note that there are two time constants associated with the previously described function. The off-delay time constant is provided by the discharging of the capacitor C9 through the resistive elements R20 and R21. The break-before-make time constant is provided by the subsequent discharge of the capacitive element C13 through the resistive elements R26 and R27. At this time it can be seen that the normally open contact NOK is once again open and the normally closed contact NCK is once again closed, thus completing the operating cycle. The purpose of the Zener diode ZD11 is to act as a regulator to limit the voltage value to which the capacitive element C13 can be ultimately charged.

OPERATION OF THE ON-DELAY CIRCUIT ONDK

Referring now to FIGS. 1, 4 and 4A, an on-delay circuit for the apparatus shown herein used in conjunction with the base module BM of FIG. 1 is described and shown. After the relay RC has closed, as described previously with respect to FIG. 1, the changing of state of both the normally open and normally closed contact is delayed by some finite period of time. However, after that period of time has expired, the normally closed contact NCK opens almost instantaneously and the normally open contact NOK closes with a slight predetermined delay, as has been described previously with respect to the break-before-make function.

Referring to FIG. 4, the status of the normally open contact NOK and the normally closed contact NCK before the switch RC is closed will be described. The normally open contact NOK remains open because power from line 28 in the form of current will not flow through the terminal 14' because the silicon controlled rectifier SCR4, which is connected to line 17, is open. There is a path from terminal 17 to terminal 30 through the SCR4 and through a resistive element R43. The terminal 17 as can be seen by referring once again to FIG. 2 is connected to the cathodes of the silicon controlled rectifiers SCR2 and SCR3 shown therein. Since the silicon controlled rectifier SCR5 is also nonconducting, the normally closed contact NCK operates similarly to the way the normally closed contact NCK shown in FIGS. 2 and 2B operates; that is, current flows from the source S5 through the regulating diode ZD15 into the terminal 14' for energizing the contact means in the normally closed contact NCK.

When the relay RC of FIG. 1 is closed, the output stage OS will provide current between the terminals 28 and 30 through the resistive elements R34 and R35 to charge the capacitive element C16. Part of the charging path includes the parallel connected resistive element R43 and diode D19. The charging of the capacitive element C16 depends upon the transistor Q10 being in the off state. Transistor Q10 is in the off state if the transistor Q9 is in the on state, and the transistor Q9 is in the on state as soon as the voltage is supplied between the terminals 28 and 30. When the voltage at the left end of the resistive element R36 reaches a predetermined value in relationship to the voltage at the bottom end of the resistive element R35a, the programmable unijunction transistor PUT1 will turn on. This provides a discharge path from the capacitive element C16 through the resistive element R36 and the resistive element R37 to thus turn on the silicon controlled rectifier SCR4. As was described previously, when the silicon controlled rectifier SCR4 is turned on, energizing power in the form of current can flow into the terminal 14' to cause the silicon controlled rectifiers in the normally open contact module NOK to fire, thus causing energization of the load LD4 by the source S4 after a predetermined time delay which is predominantly determined by the capacitive value of the capacitive element C16 and the resistive values of the resistive elements R34, R35 and to a lesser extent by resistive element R43. The current which flows out of the cathode of the programmable unijunction transistor PUT1 impresses a voltage across the resistor R37, which immediately triggers the light conductive transistor pair LCTP2. However, the turn-on of the silicon controlled rectifier SCR4 is time-delayed by the capacitive element C17. This provides the by now familiar break-before-make function, as it can be easily seen that the normally open contact NOK is closed after the normally closed contact NCK is opened. The normally closed contact NCK is opened by energizing the silicon controlled rectifier SCR5 to a conducting state. This occurs generally instantaneously with the provision of current to the resistive element R37 for reasons previously discussed. When the silicon controlled rectifier SCR5 conducts, the current path across the Zener diode ZD14 is interrupted and current consequently flows from the terminal 12 to the terminal 16 rather than from the terminal 12 to the terminal 14'. This has the effect, as was described previously, of opening the normally closed contact NCK. This thus removes the source of power S5 from the load LD5. Holding current for the SCR5 is supplied at the terminals 32 and 34, through the diode D20 and the resistive element R40. The capacitive element C20 acts as a filter capacitor for the output voltage across the terminals 32 and 34. The Zener diode ZD14 is a regulator for the filter capacitor C20. The resistive element R41 provides collector resistance for elements of the light coupled transistor pair LCTP2. The resistive element R42 acts as a damper for the gate to cathode circuit of the silicon controlled rectifier SCR5.

When the relay coil RC of FIG. 1 is opened once again, the silicon controlled rectifier SCR4 turns off when the current flowing between the terminals 28 and 30 goes to zero. However, because of the presence of the capacitive element C20, the opened normally closed contact NCK will not close again until the capacitive element C20 has discharged to a point where the silicon controlled rectifier SCR5 can no longer conduct, in which case the current from terminal 12 is provided once again through to the Zener diode ZD15 to the energizing terminal 14' of the normally closed relay NCK.

It is to be understood with respect to the embodiments of this invention that although a four secondary winding transformer T1 is preferred, the number of secondary windings is not limited, except by practical consideration. It is also to be understood that the device generally designated RC may be replaced by a pushbutton of the on-off type or any other suitable switching means including integrated circuitry, solid state circuitry or relay circuitry. It is to be understood that the presence of the light emitting diode for indicating purposes as described herein with respect to the embodiments of this invention are not limiting. It is also to be understood with respect to the embodiments of this invention that the device shown in FIG. 2 and normally designated as NOK/NCK is a dual purpose contact element which may be alternately wired for normally opened contacts or normally closed contacts. It is also to be understood that the arrangement of the various power supply elements such as S1, S2, etc., and the various loads LD1, LD2, etc., are not limiting. It will be understood that the various gated elements generally referred to as silicon controlled rectifiers may be replaced by other suitable gated elements such as thyristors or the like.

The apparatus embodying the teachings of this invention have many advantages. One advantage lies in the fact that a break-before-make function can be provided as part of a standard base module for utilization with plug-in modules. The plug-in modules may be of the normally opened or normally closed contact type or may comprise time delay on or time delay off modules. Another advantage lies in the face that the break-before-make function provided by the apparatus taught in this invention is operable not only in an energizing switching mode but also in a de-energizing switching mode. Another advantage lies in the fact that significant isolation is provided between stages by the use of isolating transformers and diode interconnecting means. Another advantage lies in the face that the break-before-make function can be provided over a wide range of applications by using the break-before-make apparatus as part of a base module rather than as an individual part of every contact arrangement. The various contact arrangements can be plugged into the base module in various arrangements at the convenience of the operator or user of the equipment. Another advantage lies in the fact that the equipment is essentially solid state; that is, it contains no mechanical or moving parts. Another advantage lies in the fact that where desired the speed of operation is significantly greater than with a mechanical contact device. Another advantage lies in the fact that the break-before-make function can be reduced to a relatively small time interval which may be as low as 8 milliseconds, which is nevertheless reliable because of the electronic components utilized within the circuitry. Another advantage lies in the face that multiple break-before-make circuits are provided in the base module such that the break of any one of them is time delayed by a rather precise amount before the make of any other of them, which provides increased versatility for the unit as a whole.

What we claim as our invention is:
1. A solid state relay, comprising:
 a. input circuit means having switch means therein; and
 b. bracketing break-before-make means connected to said switch means of said input circuit means, said bracketing break-before-make means operating to provide a first contact-break output signal at a first set of output terminals thereof generally concurrently with a first change of state of said switch means, said bracketing break-before-make means operating to provide a first contact-make output signal at a second set of output terminals thereof at a first delay time plus an on delay time after said first change of state of said switch means, said bracketing break-before-make means operating to provide a second contact-break output signal at said second set of output terminals generally conurrently with a subsequent change of state of said switch means, said bracketing break-before-make means operating to provide a second contact-make output signal at said first output terminals thereof at a second delay time plus said on delay time after said subsequent change of state of said switch means.

2. The combination as claimed in claim 1 wherein solid state contact means is connected to first set of output terminals of said bracketing break-before-make means for being actuated thereby to change state to control a circuit function.

3. The combination as claimed in claim 1 wherein solid state contact means is connected to said second set of output terminals of said bracketing break-before-make means for being actuated thereby to change state to control a circuit function.

4. The combination as claimed in claim 1 wherein first solid state contact means is connected to said first set of output terminals thereof and second solid state contact means is connected to said second set of output terminals thereof, both said first and said second solid state contact means being actuated to change state to control a circuit function.

5. A solid state relay, comprising:
a. input circuit means having switch means therein; and
b. bracketing break-before-make means connected to said switch means of said input circuit means, said bracketing break-before-make means operating to provide a first contact-break output signal at a first set of output terminals thereof at an off delay time after a first change of state of said switch means, said bracketing break-before-make means operating to provide a first contact-make output signal at a second set of output terminals thereof at a first delay time after said first change of state of said switch means, said bracketing break-before-make means operating to provide a second contact-break output signal at said second set of output terminals at said off delay time after a subsequent change of state of said switch means, said bracketing break-before-make means operating to provide a second contact-make output signal at said first output terminals thereof at a second delay time after said subsequent change of state of said switch means.

6. The combination as claimed in claim 5 wherein solid state contact means is connected to said first set of output terminals of said bracketing break-before-make means for being actuated thereby to change state to control a circuit function.

7. The combination as claimed in claim 5 wherein solid state contact means is connected to said second set of output terminals of said bracketing break-before-make means for being actuated thereby to change state to control a circuit function.

8. The combination as claimed in claim 5 wherein first solid state contact means is connected to said first set of output terminals thereof and second solid state contact means is connected to said second set of output terminals thereof, both said first and said second solid state contact means being actuated to change state to control a circuit function.

* * * * *